(12) United States Patent
Zheng

(10) Patent No.: US 7,821,312 B1
(45) Date of Patent: Oct. 26, 2010

(54) TECHNIQUES FOR SELECTING PHASES OF CLOCK SIGNALS

(75) Inventor: Leon Zheng, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/395,558

(22) Filed: Feb. 27, 2009

Related U.S. Application Data

(63) Continuation-in-part of application No. 11/737,079, filed on Apr. 18, 2007, now Pat. No. 7,532,029.

(51) Int. Cl.
*H03L 7/06* (2006.01)
(52) U.S. Cl. .................. 327/158; 327/145; 327/147
(58) Field of Classification Search ......... 327/144–161, 327/291–295
See application file for complete search history.

(56) References Cited

U.S. PATENT DOCUMENTS

| 6,104,228 | A  | * | 8/2000  | Lakshmikumar | 327/407 |
|-----------|----|---|---------|--------------|---------|
| 6,933,761 | B2 | * | 8/2005  | Chang        | 327/231 |
| 7,378,893 | B1 | * | 5/2008  | Kang         | 327/291 |
| 7,453,968 | B2 |   | 11/2008 | Chang et al. |         |
| 2005/0200390 | A1 | | 9/2005 | Starr et al. |         |
| 2005/0259775 | A1 | | 11/2005 | Chang et al. |         |

* cited by examiner

*Primary Examiner*—Dinh T. Le
(74) *Attorney, Agent, or Firm*—Steven J. Cahill

(57) ABSTRACT

A clock signal generator circuit that receives periodic signals has a delay circuit, first and second multiplexers, and flip-flops. The delay circuit delays the periodic signals to generate delayed signals. The first multiplexer selects one of the delayed signals in response to a first select signal to generate an output clock signal. The second multiplexer selects one of the periodic signals in response to a second select signal. The flip-flops generate the first and the second select signals in response to the periodic signal selected by the second multiplexer.

20 Claims, 12 Drawing Sheets

TECHNIQUES FOR SELECTING PHASES OF CLOCK SIGNALS

CROSS-REFERENCES TO RELATED APPLICATIONS

This patent application is a continuation-in-part of U.S. patent application Ser. No. 11/737,079, filed Apr. 18, 2007, which is incorporated by reference herein in its entirety.

BACKGROUND OF THE INVENTION

The present invention relates to electronic circuits, and more particularly, to techniques for selecting phases of clock signals.

The Stratix® III field programmable gate array (FPGA) manufactured by Altera Corporation of San Jose, Calif., contained the circuitry shown in FIG. 2A of the present application, which operated according to the signal timing shown in FIG. 2C of the present application. The Stratix III FPGA was sold in August of 2007.

Phase-locked loops (PLLs) are an essential building block of many integrated circuits, providing periodic signals for data recovery, data transfer, and other clocking functions. PLLs often supply a clock signal to one or more counters or dividers that divide a signal from an oscillator to a lower frequency clock signal for distribution around an integrated circuit or system. PLLs can have a voltage controlled oscillator, a current controlled oscillator, or a digitally controlled oscillator.

A programmable logic integrated circuit (IC), such as a field programmable gate array (FPGA) or a programmable logic device (PLD), typically contains programmable logic circuit blocks that can be configured to perform a variety of functions. Some programmable ICs also include PLLs that have configurable settings.

When used inside a programmable logic IC, a PLL can have many configurations. Each configuration defines a specific application use in the user mode of the programmable logic IC. The requirements for input and output frequency, bandwidth, phase relationship, jitter budget, and many other feature requirements trigger a unique configuration for a PLL.

After a FPGA chip has been programmed, and a different configuration is needed, a new configuration is loaded into the chip. Loading a new configuration forces the chip to go out of user mode. As a result, the functionality of the system gets disrupted.

BRIEF SUMMARY OF THE INVENTION

According to some embodiments of the present invention, a clock signal generator circuit that receives periodic signals has a delay circuit, first and second multiplexers, and flip-flops. The delay circuit delays the periodic signals to generate delayed signals. The first multiplexer selects one of the delayed signals in response to a first select signal to generate an output clock signal. The second multiplexer selects one of the periodic signals in response to a second select signal. The flip-flops generate the first and the second select signals in response to the periodic signal selected by the second multiplexer.

Various objects, features, and advantages of the present invention will become apparent upon consideration of the following detailed description and the accompanying drawings.

DETAILED DESCRIPTION OF THE INVENTION

Figure 1A:
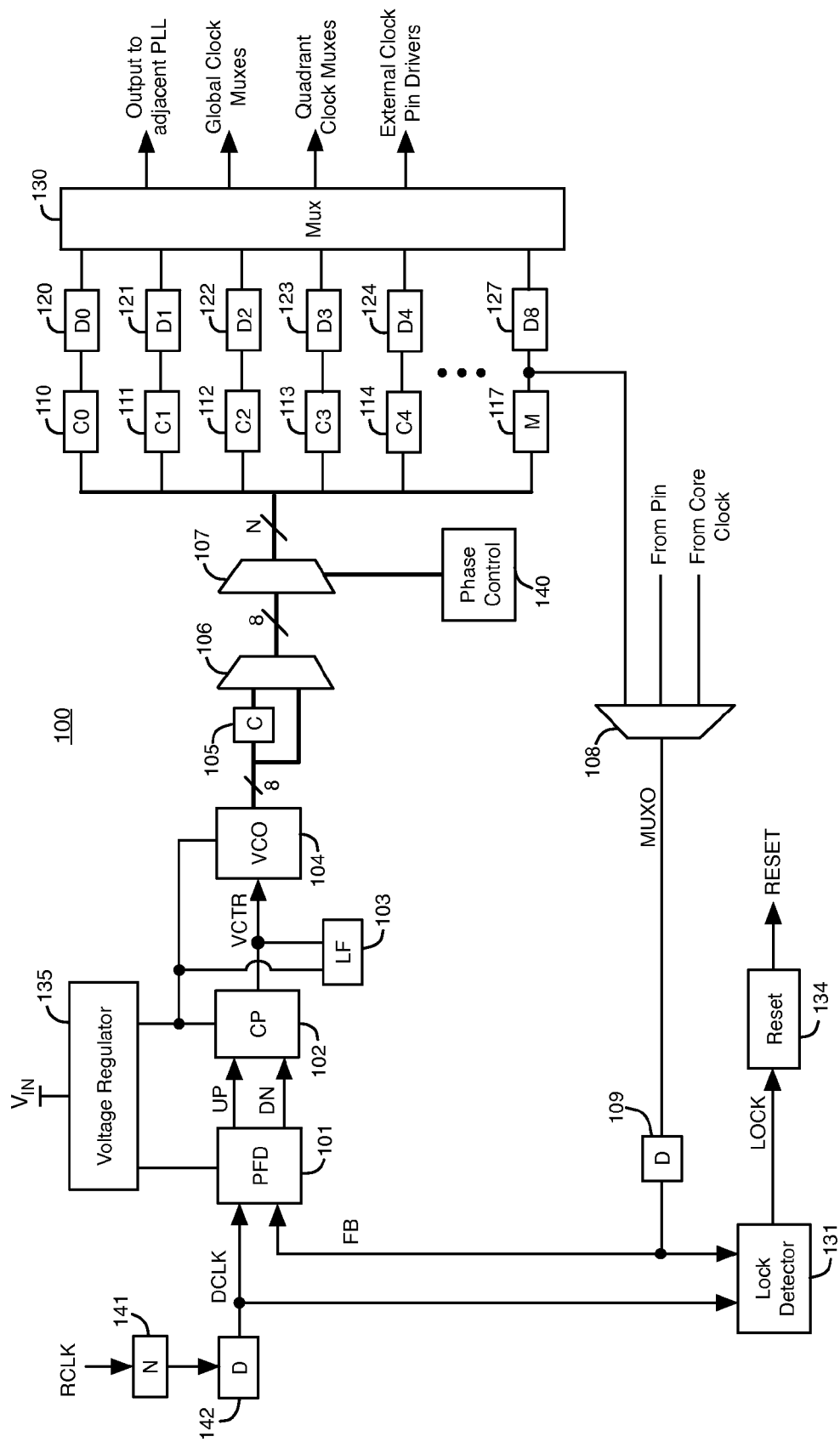
FIG. 1A illustrates a phase-locked loop (PLL) circuit with a dynamic phase shift feature, according to an embodiment of the present invention.

FIG. 1A illustrates a phase-locked loop (PLL) 100, according to an embodiment of the present invention. An input N counter circuit 141 receives an input reference clock signal RCLK at its input. RCLK is a periodic input signal. Counter 141 divides the frequency of RCLK by a frequency divider ratio N to generate an output signal. Delay circuit 142 delays the output signal of counter circuit 141 to generate clock signal DCLK. Delay circuit 142 has a programmable delay. The delay of delay circuit 142 can be programmed to compensate for any offsets in PLL 100.

The divided and delayed clock signal DCLK is transmitted to a first input of a phase frequency detector (PFD) 101. PFD 101 compares the phase and frequency of clock signal DCLK to the phase and frequency of a feedback clock signal FB to generate pulses in UP and DN output signals.

The UP and DN signals are transmitted to inputs of charge pump (CP) circuit 102. PFD 101 generates longer high pulses in the UP signal when the frequency of clock signal DCLK is higher than the frequency of feedback clock signal FB. PFD 101 generates longer high pulses in the DN signal when the frequency of feedback clock signal FB is higher than the frequency of clock signal DCLK.

CP 102 controls its output voltage VCTR in response to the UP and DN signals. The output voltage VCTR of charge pump 102 is low pass filtered by loop filter (LF) 103. CP 102 sends more charge to loop filter 103 in response to high pulses in the UP signal. CP 102 drains charge from loop filter 103 in response to high pulses in the DN signal. When high pulses in the UP signal are longer than high pulses in the DN signal, voltage VCTR increases. When high pulses in the UP signal are shorter than high pulses in the DN signal, voltage VCTR decreases.

The output voltage VCTR of LF block 103 is transmitted to an input of voltage-controlled oscillator (VCO) 104. VCO 104 is a 4-stage VCO generating 8 periodic output signals that are equally spaced 45 degrees apart from each other. The 8 periodic 45°, 90°, 135°, 180°, 225°, 270°, and 315°. The output voltage VCTR of LF 103 determines the frequency of the periodic output signals of VCO 104.

PFD 101, CP 102, LF 103, and VCO 104 each receive a power supply voltage from voltage regulator 135. Voltage regulator 135 is a DC/DC converter that converts an input voltage $V_{IN}$ into regulated power supply voltages that drive PFD 101, CP 102, LF 103, and VCO 104.

One of the periodic output signals of VCO 104 feeds back to PFD 101 as the feedback clock signal FB through multiplexers 106-107, feedback M counter 117, multiplexer 108, and delay circuit 109. VCO 104 varies the frequency its periodic output signals in response to VCTR until the input clock signal DCLK and the feedback clock signal FB are frequency and phase aligned.

PLL 100 is in lock when the input clock signal DCLK and the feedback clock signal FB are frequency and phase aligned. Lock detector 131 senses when PLL 100 is in lock. Lock detector 131 receives the output signal FB of delay circuit 109 and the output signal DCLK of delay circuit 142. Lock detector 131 generates a LOCK output signal that is provided to reset circuit 134. Lock detector 131 generates a logic high in the LOCK signal when the input clock signal DCLK and the feedback clock signal FB are frequency and phase aligned.

According to an embodiment of the present invention, PLL 100 provides an automatic reset feature that causes PLL 100 to automatically reset whenever the frequencies of clock signals DCLK and FB are no longer locked (i.e., no longer frequency and phase aligned). Reset circuit block 134 controls the automatic reset feature of PLL 100. When the LOCK signal transitions from a logic high to a logic low, reset circuit block 134 generates a logic high in the RESET signal. A logic high in the RESET signal causes components in PLL 100 to wake-up in a sequential manner. A reset allows the PLL to re-align the phases of DCLK and FB after the PLL loses lock. The components in PLL 100 that are reset by the RESET signal can, e.g., include PFD 101, CP 102, loop filter 103, VCO 104, and counters 105, 110-114 and 117.

Counter block 105 represents 8 counter circuits that are coupled to receive the 8 periodic output signals of VCO 104. Counter circuits 105 divide the frequencies of the output signals of VCO 104 by a frequency divider ratio (e.g., 2). Multiplexer 106 is coupled to VCO 104, counter block 105, and multiplexer 107. Multiplexer 106 can be programmed to transmit the 8 output signals of counter circuits 105 to 8 inputs of multiplexer 107. Alternatively, multiplexer 106 can be programmed to transmit the 8 output signals of VCO 104 directly to the 8 inputs of multiplexer 107. Multiplexer 106 can represent 8 separate multiplexers, one for each of the VCO output signals.

Multiplexer 107 couples the 8 outputs of multiplexer 106 to a number N of counter circuits, including counter circuits 110-114 and 117. PLL 100 can have any number of C output counters 110-114, in addition to a feedback counter M 117. Each of the counter circuits 110-114 and 117 receives one of the output signals of multiplexer 107. The counter circuits 110-114 and 117 are frequency divider circuits. The output signals of counter circuits 110-114 and 117 are delayed by delay circuits 120-124 and 127, respectively.

The output signals of delay circuits 120-124 and 127 are transmitted to inputs of output multiplexer 130. Multiplexer 130 routes output clock signals from PLL 100 to various destinations on the integrated circuit chip. For example, output clock signals from PLL 100 can be routed to an adjacent PLL, global multiplexers, quadrant multiplexers, and external clock pin drivers.

The output signal of feedback M counter 117 is transmitted to an input of multiplexer 108. Multiplexer 108 selectively drives the output signal of counter 117, a clock signal from the core circuitry of the chip, a clock signal from a pin of the chip, or another clock signal to an input of delay circuit 109. Delay circuit 109 transmits the output signal MUXO of multiplexer 108 to the second input of PFD 101 and an input of lock detector 131. The output signal of delay circuit 109 is the feedback clock signal FB. Delay circuit 109 has a programmable delay that can be adjusted to compensate for offsets in PLL 100.

PLL 100 can generate periodic signals having multiple phases that can be selected and generated dynamically. This dynamic phase shift feature is useful for applications such as double-data rate (DDR) transfers and synchronous dynamic random access memory (SDRAM). The dynamic phase shift feature is used to capture DDR-SDRAM data on both the negative and positive edges of the clock signal. The dynamic phase shift feature can be supported for a wide output frequency range with up to 32 phases over one clock period.

The architecture of PLL 100 allows the phases of the output signals of a phase-locked loop to be dynamically adjusted relative to each other and the reference clock signal RCLK. PLL 100 has a 4-stage VCO 104 generating 8 signals that are 45 degrees apart in phase. Multiplexer 107 selectively routes the eight output signals of VCO 104 in response to phase-tap signals from phase control circuit block 140. The phase-tap signals can cause multiplexer 107 to adjust the phases of the VCO output signals that are transmitted to each counter circuit. In a programmable logic integrated circuit, the phase shifting can occur during user mode.

Figure 1B:
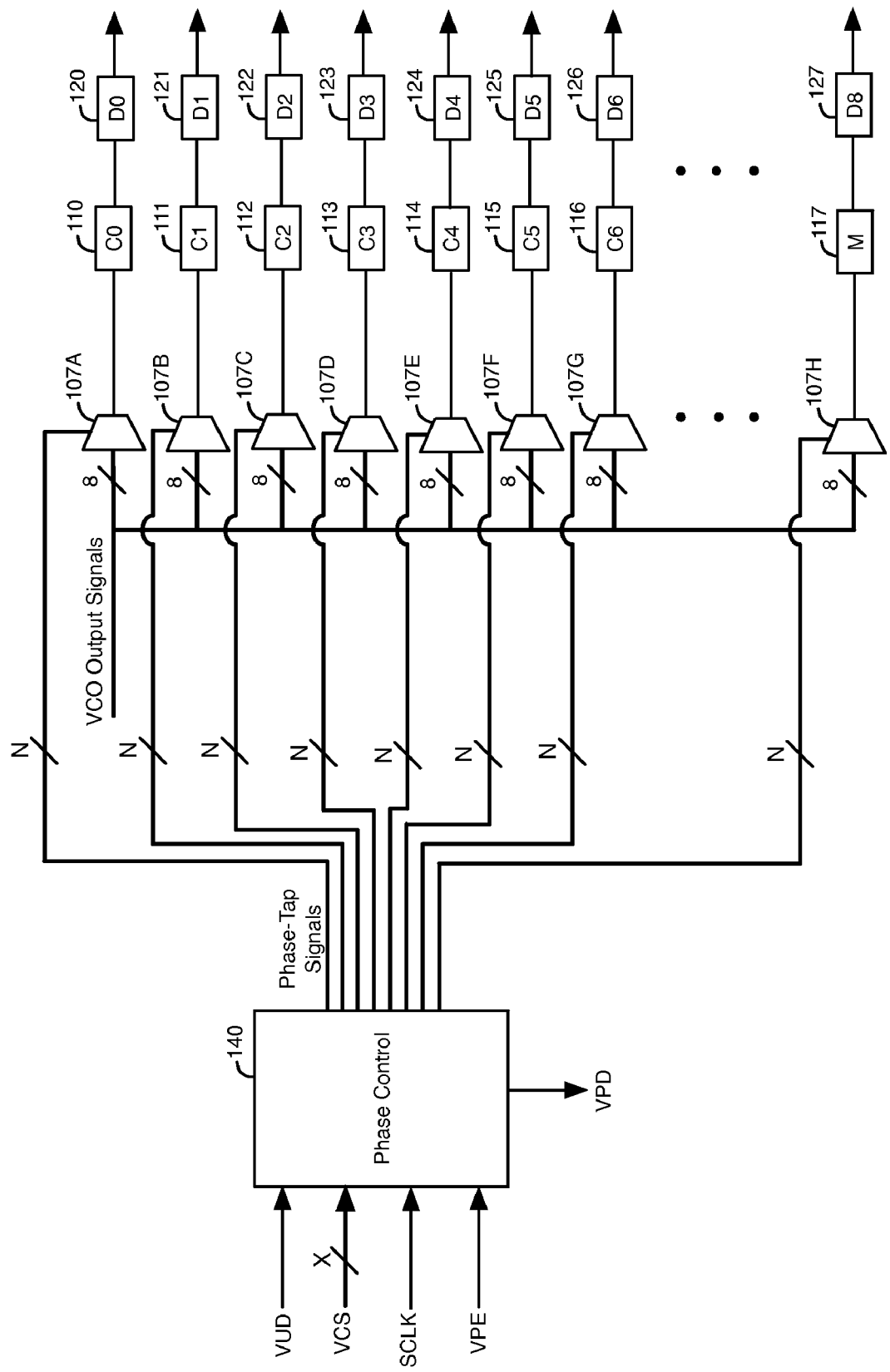
FIG. 1B illustrates additional details of the dynamic phase shift circuitry shown in FIG. 1A, according to a further embodiment of the present invention.

Further details of the phase shift circuitry of PLL 100 are shown in FIG. 1B. Multiplexer 107 in FIG. 1A represents several multiplexer circuits. FIG. 1B, for example, illustrates 8 multiplexers 107A-107H that are part of multiplexer 107. Each of multiplexers 107A-107H selectively couples one of the 8 VCO output signals from multiplexer 106 to an input of one of counter circuits 110-117, respectively. The output signals of counter circuits 110-117 are delayed by delay circuits 120-127, respectively. Delay circuits 120-127 have a programmable delay that can be adjusted to compensate for variable offsets in PLL 100.

Phase control circuit 140 generates multiple sets of phase-tap signals. Eight sets of phase taps signals are shown in FIG. 1B as an example. Each set of the phase tap signals includes an N number of phase tap signals. Each set of the phase tap signals is transmitted to N select inputs of one of multiplexers 107A-107H through a separate set of parallel conductors. The phase tap signals control when the multiplexers 107A-107H shift the phases of their output signals.

Phase control circuit 140 generates the phase-tap signals in response to input signals VUD, VCS, SCLK, and VPE. Phase control circuit 140 receives a set of counter selection signals VCS[0]-VCS[X−1]. Typically, N equals $2^X$. The counter selection signals VCS[0]-VCS[X−1] separately enable or disable the phase tap signals that are transmitted to each multiplexer 107A-107H. Thus, the phase of the output signal generated by each multiplexer 107A-107H can be dynamically shifted independently of the other multiplexers.

For example, if VCS0 is high, and VCS1 is low, the phase-tap signals transmitted to multiplexer 107A are enabled to change state in response to SCLK and VUD, and at the same time, the phase-tap signals transmitted to multiplexer 107B remain constant. As a result, multiplexer 107A can shift the phase of its output signal in response to a change in the phase-tap signals, and multiplexer 107B keeps the phase of its output signal constant.

Phase control circuit 140 also receives a phase enable input signal VPE. Phase control circuit 140 maintains all of the phase-tap signals that are transmitted to multiplexers 107A-107H constant when VPE is a logic low. When VPE is a logic high, phase control circuit 140 allows the phase-tap signals that are selected by the counter selection signals VCS to be adjusted. Phase control circuit 140 generates a phase-done output signal VPD that transitions to a logic high value when any phase shifts caused by changes in the phase-tap signals are completed.

VUD is an up/down signal that controls the direction of phase shift of the output signals of multiplexers 107A-107H. The phases of the multiplexer output signals increase when VUD is in a first logic state and decrease when VUD is in a second logic state. Directional signal VUD and a clock signal SCLK control changes in the phase-tap signals. For example, the logic states of each set of N phase-tap signals can be adjusted on each rising edge of clock signal SCLK when the VPE signal and the corresponding VCS signal are high. The phases of the periodic output signals of multiplexers 107A-107H are dynamically phase shifted in response to changes in the phase tap signals.

Phase control circuit 140 can individually change the phases of the output clock signals of multiplexers 107A-107H by different phase adjustments. For example, the phase of the output clock signal of multiplexer 107A can be adjusted from 0° to 45°, the phase of the output clock signal of multiplexer 107B can be adjusted from 45° to 180°, and the phase of the output clock signal of multiplexer 107C can be adjusted from 90° to 315°.

As another example, the phase of the output clock signal of multiplexer 107A can be adjusted from 90° to 225°, the phase of the output clock signal of multiplexer 107B can be adjusted from 135° to 180°, and the phase of the output clock signal of multiplexer 107C can be adjusted from 180° to 270°.

Each discrete change in the phase-tap signals causes the phases of the output signals of multiplexers 107A-107H to be shifted by ⅛ of the frequency of the VCO output signals. The counters 110-117 accumulate the phase shifts so that a phase adjustment can be made that equals more than one period of the VCO output signals.

The output clock signals of VCO 104 can be separated by 45 degree phase shifts (i.e., ⅛ the period $T_{VCO}$ of the VCO output signals), as described above. Even when VCO 104 generates 8 output clock signals separated by 45 degree phase shifts, PLL 100 can generate output clock signals separated by equally spaced phase shifts that are smaller than 45 degrees. PLL 100 can generate smaller phase shifts by dividing the frequency of the VCO output signal using counters 110-117, etc. For example, the output counters can divide the frequency of each of the 8 VCO output signals by 4 to generate clock signals having 32 equally-spaced phases. As another example, the output counters can divide the frequency of each of the 8 VCO output signals by 2 to generate output signals having 16 equally-spaced phases.

Figure 2A:
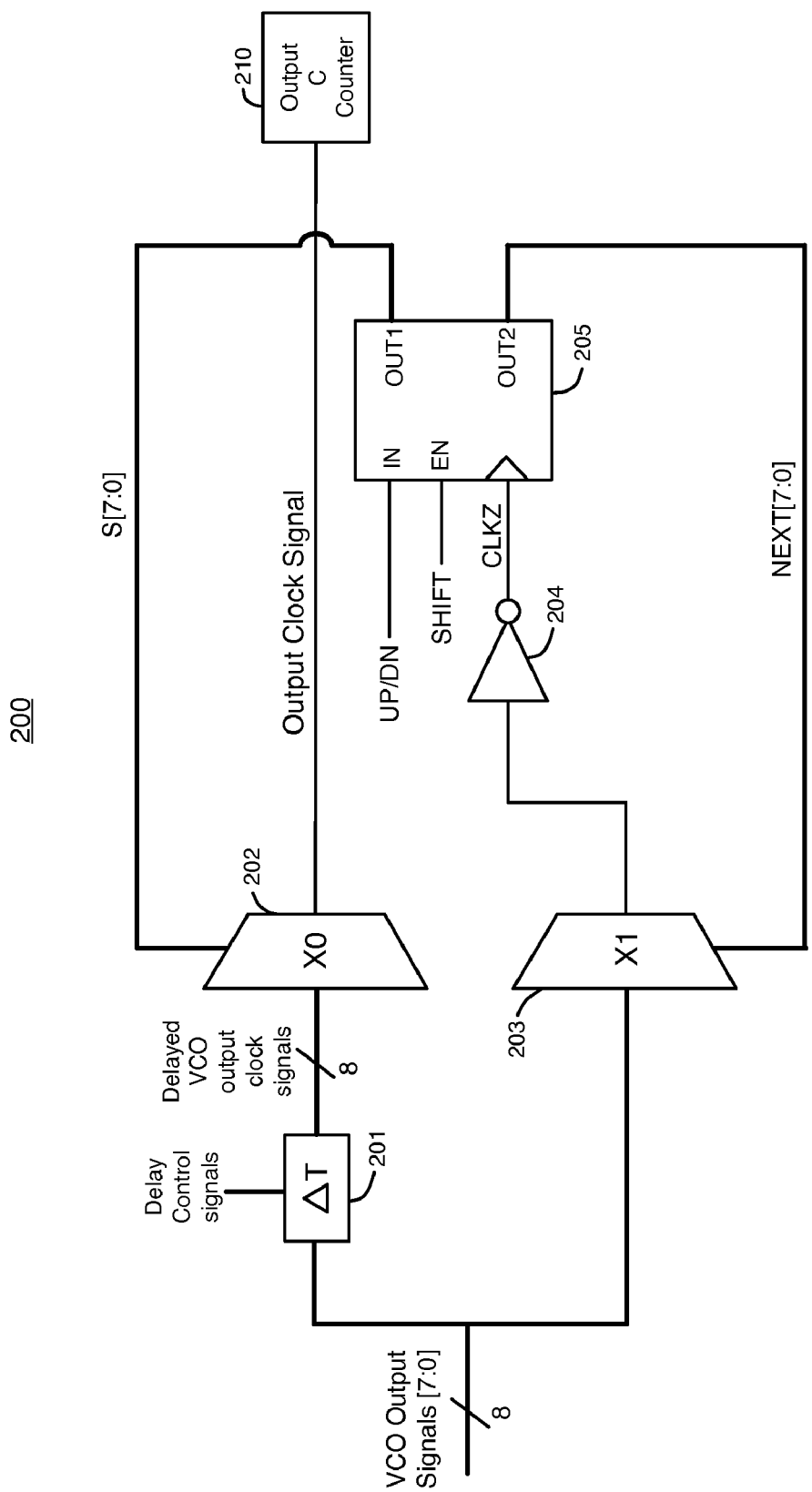
FIG. 2A illustrates circuitry that can be used to dynamically shift the phase of high frequency VCO output signals without causing glitches, according to another embodiment of the present invention.

FIG. 2A illustrates an example of circuitry that can dynamically shift the phase of high frequency VCO output signals without causing glitches, according to another embodiment of the present invention. Phase shift circuit 200 of FIG. 2A includes programmable delay circuit cell 201, 8-to-1 multiplexers 202-203, inverter 204, and barrel shifter 205. According to an embodiment of the present invention, each of the multiplexers 107A-107H shown in FIG. 1B includes the phase shift circuit 200 of FIG. 2A. Output C counter 210 represents one of counters 110-117 in FIG. 1B.

Eight VCO output clock signals [7:0] are transmitted from VCO 104 to phase shift circuit 200 through multiplexer 106. The period of the VCO output clock signals is referred to herein as $T_{VCO}$. The VCO output clock signals are transmitted to inputs of programmable delay cell 201 and multiplexer 203. Programmable delay circuit cell 201 delays the VCO output clock signals to generate 8 delayed VCO output clock signals. The delayed VCO output clock signals are transmitted from delay cell 201 to inputs of multiplexer 202. Programmable delay cell 201 has a variable delay that is determined by the states of a set of delay control signals.

Multiplexer 202 selects one of the delayed VCO output clock signals from delay cell 201 and transmits the selected delayed VCO output clock signal to an input of output C counter 210 as the output clock signal. Multiplexer 203 selects one of the VCO output clock signals and transmits the selected VCO output clock signal to an input of inverter 204. Inverter 204 inverts the selected VCO output clock signal and transmits the inverted VCO signal CLKZ to a clock input of barrel shifter 205.

Multiplexer 203 selects a VCO output clock signal having a phase that is after the phase of the delayed VCO output clock signal selected by multiplexer 202. For example, the phase of the output clock signal of multiplexer 203 can be (⅛)*($T_{VCO}$) after the phase of the output clock signal of multiplexer 202.

Barrel shifter 205 contains a series of flip-flops that are coupled together to perform a barrel shifting function. To prevent glitches on the output clock signal of multiplexer 202, the flip-flops in barrel shifter 205 are clocked with the falling edge of the VCO output clock signal selected by multiplexer 203.

A SHIFT signal is transmitted to an enable input EN of barrel shifter 205. The SHIFT signal initiates the phase shifting. When the SHIFT signal is a logic high, barrel shifter 205 is enabled to commence the barrel shifting function.

Barrel shifter 205 generates 8 select signals S[7:0] that are transmitted to 8 select inputs of multiplexer 202. The states of select signals S[7:0] determine which of the 8 delayed VCO output clock signals that multiplexer 202 transmits to output counter 210. Thus, select signals S[7:0] select the phase for the output clock signal of multiplexer 202.

An UP/DN signal is transmitted to an input IN of barrel shifter 205. The UP/DN signal controls the direction of the barrel shifting and the phase relationship of the new output clock signal of multiplexer 202 relative to the previous output clock signal of multiplexer 202.

Barrel shifter 205 changes the states of the select signals S[7:0] in response to the UP/DN signal, the SHIFT signal, and the clock signal CLKZ from inverter 204 to cause multiplexer 202 to select a different one of the delayed VCO clock signals from delay cell 201. When the SHIFT signal goes high, and the UP/DN signal is high, barrel shifter 205 changes the states of select signals S[7:0] so that the new output clock signal selected by multiplexer 202 is behind the previous output clock signal selected by multiplexer 202. When the SHIFT signal goes high, and the UP/DN signal is low, barrel shifter 205 changes the states of the select signals S[7:0] so that the new clock signal selected by multiplexer 202 is ahead of the previous output clock signal selected by multiplexer 202.

Barrel shifter 205 also generates 8 select signals NEXT[7:0] that are transmitted to 8 select inputs of multiplexer 203. Multiplexer 203 selects one of the 8 VCO output clock signals based on the states of select signals NEXT[7:0]. The VCO output clock signal selected by multiplexer 203 is transmitted to inverter 204. The output clock signal CLKZ of inverter 204 clocks barrel shifter 205. Select signals NEXT[7:0] determine the phase of the clock signal CLKZ that is used to clock the flip-flops in barrel shifter 205.

When the Shift signal goes high, barrel shifter 205 changes the states of the select signals S[7:0], and at the same time, barrel shifter 205 changes the states of the NEXT[7:0] signals. Each change in the states of the NEXT[7:0] signals causes multiplexer 203 to adjust the phase of clock signal CLKZ by ⅛ of a clock cycle after the phase of the currently selected clock signal.

The critical path for the phase shifting is the delay through multiplexer 203 plus the delay through the flip-flops in barrel shifter 205. When this delay is greater than, for example, ⅜ of the VCO clock period $T_{VCO}$, multiplexer 202 may switch between VCO clock signals after the rising edge of the newly selected VCO clock signal, possibly causing the output clock signal of multiplexer 202 to have a glitch. Glitches in the output clock signal can cause the feedback counter and the output counters in the PLL (e.g., counter 210) to generate false clocking. The delay of multiplexer 203 and barrel shifter 205 can be greater than ⅜*$T_{VCO}$ when the VCO output signals have higher frequencies.

According to an embodiment of the present invention, phase shift circuit 200 uses programmable delay cell 201 to compensate for the critical path through multiplexer 203 and barrel shifter 205. For example, the delay control signals can be set to select a delay for delay cell 201 that causes the delay through delay cell 201 plus the delay through multiplexer 202 to be equal to (or greater than) the delay through multiplexer 203 plus the delay through the flip-flops in barrel shifter 205. As a result, programmable delay cell 201 allows phase shift circuit 200 to support VCO output clock signals having much higher frequencies, without causing glitches.

Figure 2B:
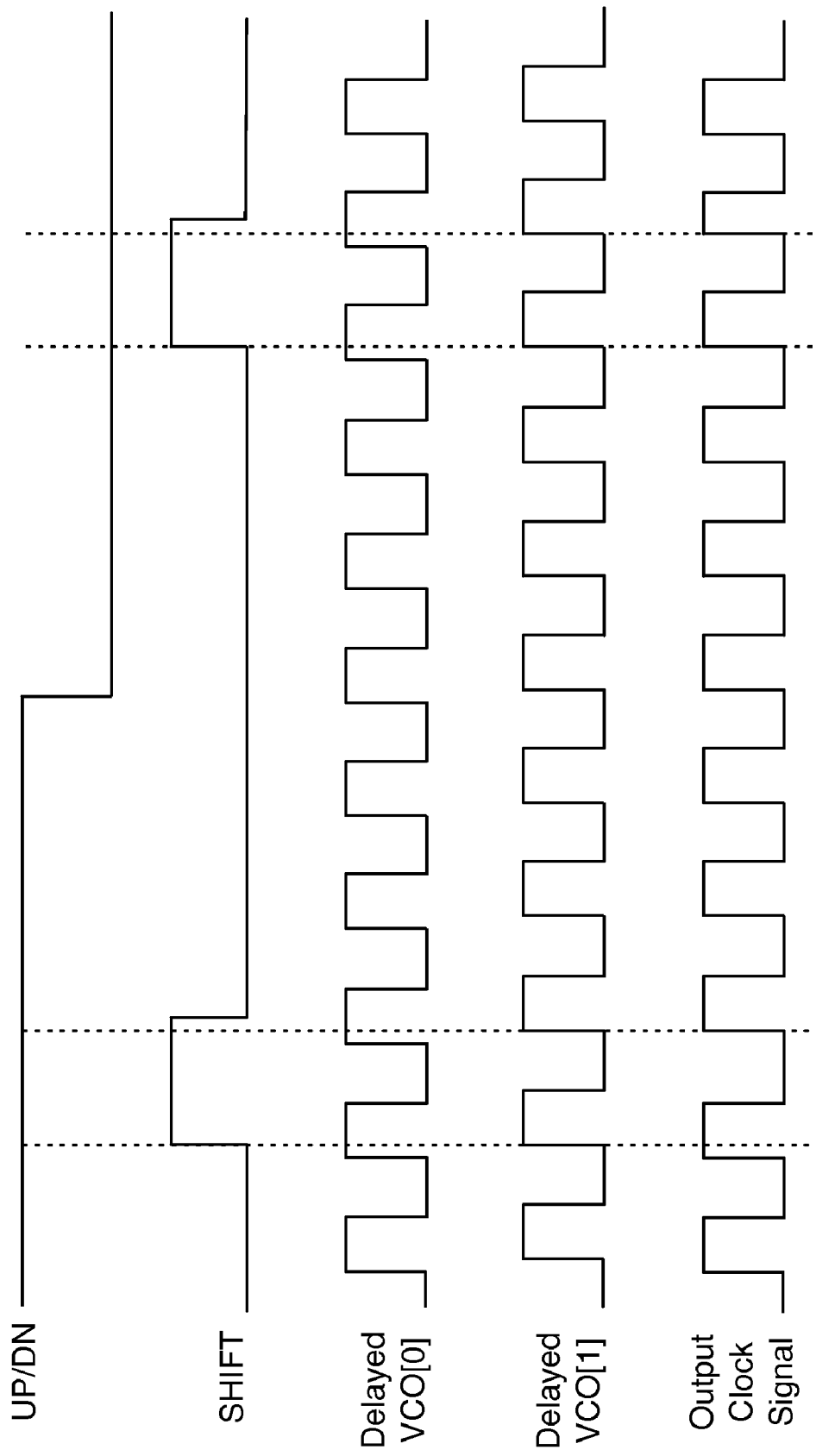
FIG. 2B is a timing diagram that illustrates an example of the operation of the phase shift circuit shown in FIG. 2A, according to an embodiment of the present invention.

FIG. 2B is a timing diagram that illustrates an example of the operation of phase shift circuit 200, according to an embodiment of the present invention. When the SHIFT signal transitions from low to high, and the UP/DN signal is high, barrel shifter 205 causes multiplexer 202 to switch from the first delayed VCO[0] output signal to the second delayed VCO[1] output signal of delay cell 201. Because the delay through delay cell 201 plus the delay through multiplexer 202 is equal to the delay through multiplexer 203 plus the delay through the flip-flops in barrel shifter 205, a glitch does not appear in the output clock signal of multiplexer 202. When the SHIFT signal transitions from low to high, and the UP/DN signal is low, barrel shifter 205 causes multiplexer 202 to switch from the second delayed VCO[1] output signal back to the first delayed VCO[0] output signal of delay cell 201.

Figure 2C:
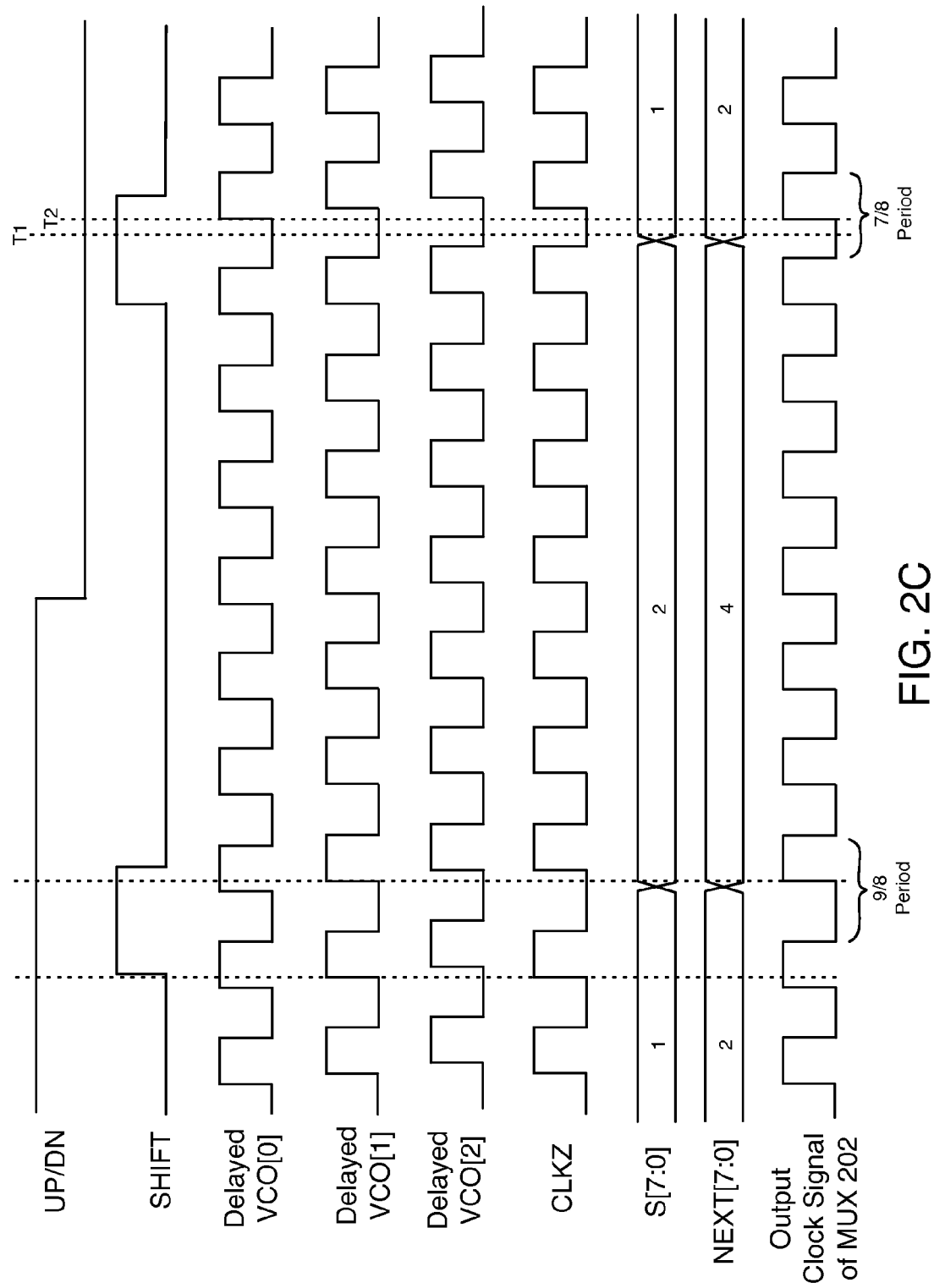
FIG. 2C is a timing diagram that illustrates example waveforms of signals in the phase shift circuit of FIG. 2A using a particular configuration of the programmable delay cell.
Figure 2D:
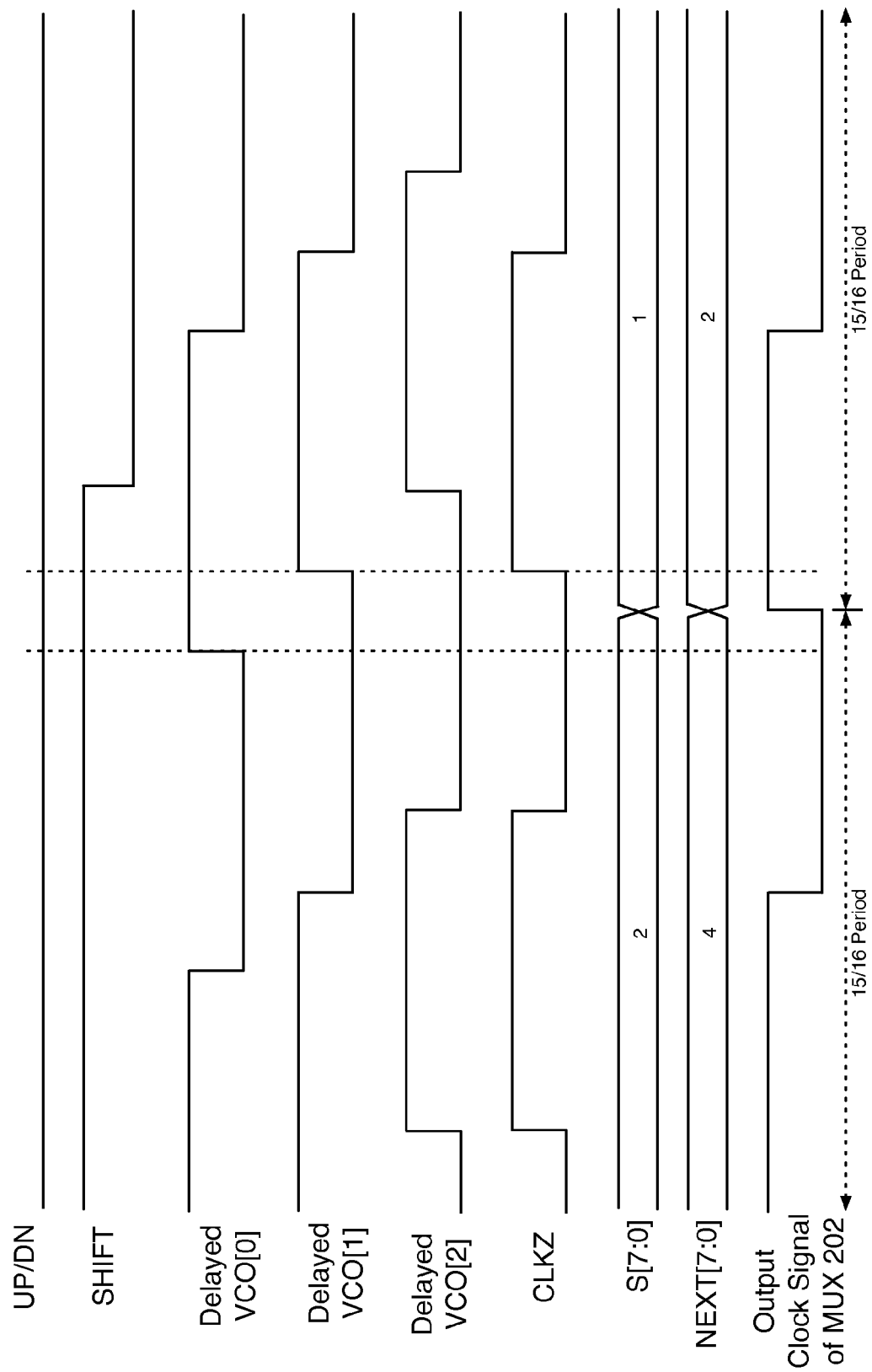
FIG. 2D is a timing diagram that illustrates example waveforms of signals in the phase shift circuit of FIG. 2A using another configuration of the programmable delay cell, according to an embodiment of the present invention.

FIG. 2C is a timing diagram that illustrates example waveforms of signals in the phase shift circuit of FIG. 2A using a particular configuration of programmable delay circuit cell 201. As described above, the 8 output clock signals of VCO 104 are delayed by delay cell 201 to generate 8 delayed VCO output clock signals. Three of these delayed VCO output clock signals are shown in FIGS. 2C-2D as delayed VCO[0], delayed VCO[1], and delayed VCO[2]. The delayed VCO[1] signal is delayed by ⅛ of a clock period relative to the delayed VCO[0] signal, and the delayed VCO[2] signal is delayed by ⅛ of a clock period relative to the delayed VCO[1] signal. Multiplexer 202 selects one of the delayed VCO output clock signals VCO[0-7] as its output clock signal. The selected output clock signal of multiplexer 202 is transmitted to counter circuit 210.

According to one embodiment, barrel shifter 205 generates 7 zero bits (i.e., 7 signals in logic low states) and a single 1 bit (i.e., a signal in a logic high state) among the select signals S[7:0], and barrel shifter 205 generates 7 zero bits and a single 1 bit among select signals NEXT[7:0]. In the example of FIG. 2C, multiplexer 202 initially selects the delayed VCO[0] clock signal as its output clock signal in response to select signals S[7:0] having a binary value of 1 (i.e., 00000001), and multiplexer 203 causes CLKZ to be in phase with the delayed VCO[1] clock signal in response to the NEXT[7:0] signals having a binary value of 2 (i.e., 00000010).

After the Shift signal transitions to a logic high state, the UP/DN signal is in a logic high state, and a falling edge occurs in CLKZ, the barrel shifter 205 shifts the 1 bit in the S[7:0] select signals to the left by one bit position to change the S[7:0] signals from a binary value of 1 to a binary value of 2, and barrel shifter 205 shifts the 1 bit in the NEXT[7:0] select signals to the left by one bit position to change the NEXT[7:0] signals from a binary value of 2 to a binary value of 4 (i.e., 00000100). After select signals S[7:0] have changed to a binary value of 2, multiplexer 202 selects the delayed VCO[1] clock signal as its output clock signal, as illustrated in the bottom waveform of FIG. 2C. After select signals NEXT[7:0] have changed to a binary value of 4, multiplexer 203 causes the CLKZ signal to be in phase with the delayed VCO[2] clock signal.

After the S[7:0] select signals change state from a binary value of 1 to a binary value of 2 in the example of FIG. 2C, counter circuit 210 receives a period in the output clock signal of multiplexer 202 that lasts ⁹⁄₈ times the clock period of the output clock signals of VCO 104, because the output clock signal of multiplexer 202 changes from the delayed VCO[0] clock signal to the delayed VCO[1] clock signal. Subsequently, the Shift signal transitions to a logic low state again.

After the beginning of another logic high pulse in the Shift signal, the UP/DN signal is in a logic low state, and a falling edge occurs in CLKZ, barrel shifter 205 shifts the 1 bit in select signals S[7:0] to the right by one bit position to change the S[7:0] signals from a binary value of 2 back to a binary value of 1, and barrel shifter 205 shifts the 1 bit in select signals NEXT[7:0] to the right by one bit position to change the NEXT[7:0] signals from a binary value of 4 back to a binary value of 2. By time T1 in FIG. 2C, signals S[7:0] have changed to a binary value of 1, and signals NEXT[7:0] have changed to a binary value of 2. After select signals S[7:0] have changed to a binary value of 1, multiplexer 202 selects the delayed VCO[0] clock signal as its output clock signal again, as illustrated in the bottom waveform of FIG. 2C.

Subsequently, the rising edge of the delayed VCO[0] clock signal coincides with the rising edge of the output clock signal of multiplexer 202 at time T2, which occurs after time T1. A rising edge in the delayed VCO[1] clock signal occurs ⅛ of a clock period after time T2. After select signals NEXT[7:0] have changed to a binary value of 2, the CLKZ signal is now in phase with the delayed VCO[1] clock signal again. After the S[7:0] select signals change state from a binary value of 2 to a binary value of 1 in the example of FIG. 2C, counter circuit 210 receives a period in the output clock signal of multiplexer 202 that lasts ⅞ times the clock period of the output clock signals of VCO 104, while the output clock signal of multiplexer 202 changes from the delayed VCO[1] clock signal to the delayed VCO[0] clock signal.

FIG. 2D is a timing diagram that illustrates example waveforms of signals in the phase shift circuit of FIG. 2A using another configuration of programmable delay circuit cell 201, according to an embodiment of the present invention. According to an embodiment of phase shift circuit 200 that is described with respect to FIG. 2D, the delays that delay cell 201 provides to the delayed VCO output clock signals have been decreased to decrease the delays of the delayed VCO output clock signals relative to the embodiment of FIG. 2C. As a result, the phase differences between the delayed VCO output clock signals and the output clock signals of VCO 104 are smaller in the embodiment of FIG. 2D than in the embodiment of FIG. 2C.

According to an embodiment of the present invention, the delays that delay cell 201 provides to the delayed VCO output clock signals cause the select signals S[7:0] and NEXT[7:0] to change state between the rising edge of the previous delayed VCO output clock signal selected by multiplexer 202 and the rising edge of the next delayed VCO output clock signal selected by multiplexer 202 when phase shift circuit 200 is performing a negative phase shift. A negative phase shift occurs when the select signals S[7:0] change state to cause the phase (e.g., the rising and falling edges) of the output clock signal of multiplexer 202 to occur earlier in time. A positive phase shift occurs when the select signals S[7:0] change state to cause the phase of the output clock signal of multiplexer 202 to occur later in time. According to a particular embodiment, the delays that delay cell 201 provides to the delayed VCO output clock signals cause select signals S[7:0] and NEXT[7:0] to change state approximately midway between the rising edge of the previous delayed VCO output clock signal selected by multiplexer 202 and the rising edge of the next delayed VCO output clock signal selected by multiplexer 202 when phase shift circuit 200 is performing a negative phase shift.

In the example of FIG. 2D, the select signals S[7:0] and NEXT[7:0] change state halfway between the rising edge of the delayed VCO[0] signal and the rising edge of the delayed VCO[1] signal to cause the output clock signal of multiplexer 202 to change from the delayed VCO[1] signal to the delayed VCO[0] signal. The select signals S[7:0] and NEXT[7:0] change state in FIG. 2D when the UP/DN signal is in a logic low state, the Shift signal is in a logic high state, the delayed VCO[0] signal is in a logic high state, and the delayed VCO[1] signal is still in a logic low state. The output clock signal of multiplexer 202 changing from the delayed VCO[1] signal to the delayed VCO[0] signal is an example of a negative phase shift.

In the embodiment of phase shift circuit 200 shown in FIG. 2D, the phase shift in the output clock signal of multiplexer 202 occurs over two clock cycles that each have a period of 15/16 times the period of the output clock signals of VCO 104. For example, when phase shift circuit 200 performs a negative phase shift from the delayed VCO[1] signal to the delayed VCO[0] signal as shown in FIG. 2D, phase shift circuit 200 generates two clock cycles in the output clock signal of multiplexer 202 that each have a period of 15/16 times the period of the output clock signals of VCO 104. As a result, counter 210 receives two periods in the output clock signal of multiplexer 202, wherein each of these two periods equals 15/16 times the period of the VCO output clock signals.

By splitting the phase change in the output clock signal of multiplexer 202 over two clock cycles, counter circuit 210 has more time to count each of these two shortened clock cycles in the output clock signal of multiplexer 202 before the end of each clock cycle, compared to the time counter 210 has to count the 7/8 period in the output clock signal of multiplexer 202 in FIG. 2C. Decreasing the delays of delay cell 201 to cause the select signals S[7:0] and NEXT[7:0] to change state midway between rising edges in the previous delayed VCO output clock signal and the next delayed VCO output clock signal provides extra timing margin for counter circuit 210. The extra timing margin allows counter circuit 210 and the phase-locked loop 100 to support clock signals that have larger frequencies.

Decreasing the delays of delay cell 201 also causes the select signals S[7:0] and NEXT[7:0] to change state later in time relative to the phases of the delayed VCO[0-7] output clock signals during a positive phase shift. However, the phase change in the output clock signal of multiplexer 202 during a positive phase shift still occurs over a single clock period in the FIG. 2D embodiment of phase shift circuit 200. In this embodiment, counter circuit 210 still receives a single clock period in the output clock signal of multiplexer 202 that equals 9/8 times the period of the VCO output clock signals. However, the increased length of the period of the output clock signal of multiplexer 202 does not adversely affect the timing margin of counter circuit 210.

Decreasing the delays of delay circuit cell 201 also provides additional advantages. The delays of programmable delay circuit cell 201 can be reduced, for example, by adjusting the logic states of the delay control signals to generate smaller delays in programmable delay circuit cell 201. The delays of programmable delay circuit cell 201 can also be reduced, for example, by redesigning delay circuit cell 201 to have a smaller number of delay circuits. Delay circuit cell 201 can, for example, be constructed of sets of delay circuits. The delay circuits in each set can be coupled together in series to delay one of the VCO output clock signals. For example, each set of delay circuits in cell 201 can have an even number of CMOS inverter circuits coupled in series. The delay of delay cell 201 can be reduced by removing one or more of the delay circuits from each set of the delay circuits in cell 201. Removing delay circuits, and thus transistors, from delay cell 201 reduces the power that phase shift circuit 200 draws from the power supply voltage and reduces the die size area of delay cell 201. Programmable delay circuit cell 201 typically provides the same amount of delay to each of the delayed VCO output clock signals.

Each transistor in delay cell 201 may generate a small amount of noise in the output clock signal of multiplexer 202. Designing delay cell 201 to have a smaller number of delay circuits, and thus a smaller number of transistors, reduces the jitter in the output clock signal of multiplexer 202 that is caused by the transistors in delay cell 201.

Local process variations can cause mismatches between the dimensions (e.g., width-to-length channel ratios) of the transistors in delay cell 201. By designing delay cell 201 to have a smaller number of transistors, the number of transistors in delay cell 201 that have mismatches is reduced, and as a result, the overall effects of mismatches between transistors in delay cell 201 is reduced.

According to some embodiments, the delays of delay circuit cell 201 can be decreased to cause the logic states of the select signals S[7:0] and NEXT[7:0] to change while the delayed VCO output clock signal currently selected by multiplexer 202 is in a logic low state and the next delayed VCO output clock signal that will be selected by multiplexer 202 after a negative phase shift is in a logic high state. The current and the next delayed VCO output clock signals are separated in phase by 1/Q times the period of the VCO output clock signals, where Q is the number of VCO output clock signals delayed by delay cell 201 and transmitted to multiplexer 202.

Multiplexer 202 can shift the phase of its selected output clock signal between two delayed VCO output clock signals that are 1/Q apart in phase. A K number of separate high pulses in the Shift signal can be generated while the UP/DN signal is in a logic high state to generate a positive phase shift in the multiplexer 202 output clock signal of (K×360°)/Q. A K number of separate high pulses in the Shift signal can be generated while the UP/DN signal is in a logic low state to generate a negative phase shift in the multiplexer 202 output clock signal of (K×360°)/Q.

According to some embodiments of the present invention, methods for phase shifting periodic output signals are provided. The method comprises delaying the periodic output signals using a delay circuit to generate delayed signals. The method also comprises selecting one of the delayed signals in response to first select signals using a first multiplexer to provide an output clock signal, and selecting one of the periodic output signals in response to second select signals using a second multiplexer. The method further comprises changing states of at least one of the first select signals in response to the selected periodic output signal to cause the first multiplexer to generate a phase shift in the output clock signal. The method can further comprise generating the first and the second select signals using a set of flip-flops in response to the selected periodic output signal.

According to additional embodiments of the present invention, the step of changing the states of at least one of the first select signals in response to the selected periodic output signal to cause the first multiplexer to generate the phase shift in the output clock signal further comprises changing the states of at least one of the first select signals in response to the selected periodic output signal using a barrel shifter circuit. According to further embodiments of the present invention, the barrel shifter circuit shifts a phase of the output clock signal in a first direction in response to a first logic state on a directional signal, and the barrel shifter circuit shifts a phase of the output clock signal in a second direction in response to a second logic state on the directional signal.

According to further embodiments of the present invention, the method further comprises adjusting a delay that the delay circuit provides to the delayed signals in response to at least one control signal to prevent glitches in the output clock signal. According to additional embodiments of the present invention, an oscillator in a phase-locked loop generates the periodic output signals, and the phase-locked loop is located on a programmable logic integrated circuit.

The periodic output signals of a voltage-controlled oscillator (VCO) in a PLL typically have a valid operating frequency range. If the frequencies of the VCO output signals move outside the valid operating range, the performance of the VCO can degrade substantially. For example, a substantial amount of jitter may be introduced into the VCO output clock signals. Depending on the design margin of other circuitry in the PLL, some circuit blocks may not be able to keep up with an increased output frequency of the VCO, causing a functional failure in the PLL.

Many system applications require a phase-locked loop that can be reconfigured. For example, if the original PLL configuration does not accommodate a change in the input and output frequency requirements of the system, the PLL can be reconfigured to support the new input and output frequency requirements so that the PLL can continue to function properly. As another example, different performance requirements can also trigger the need for a PLL to be dynamically reconfigured. Also, a change in the noise injection from the input and power supply voltages, and/or a change in the input and output clock phase relationship or duty cycle can trigger a need to reconfigure the PLL.

According to another embodiment of the present invention, a phase-locked loop (PLL), a delay-locked loop (DLL), or another type of programmable circuit block in a programmable IC can be dynamically reconfigured while in the user mode, without having to reconfigure all of the other peripheral programmable circuit blocks on the IC. This embodiment of the present invention provides a time saving technique for dynamically reconfiguring a PLL or other programmable circuit block. This embodiment also allows a programmable IC to continue operating in user mode without shutting down, while the settings of a PLL or another type of circuit block in the IC are reconfigured. The programmable settings of a PLL or another peripheral circuit block can be reconfigured without having to also reconfigure all of the other peripheral circuit blocks on the IC.

Figure 3:
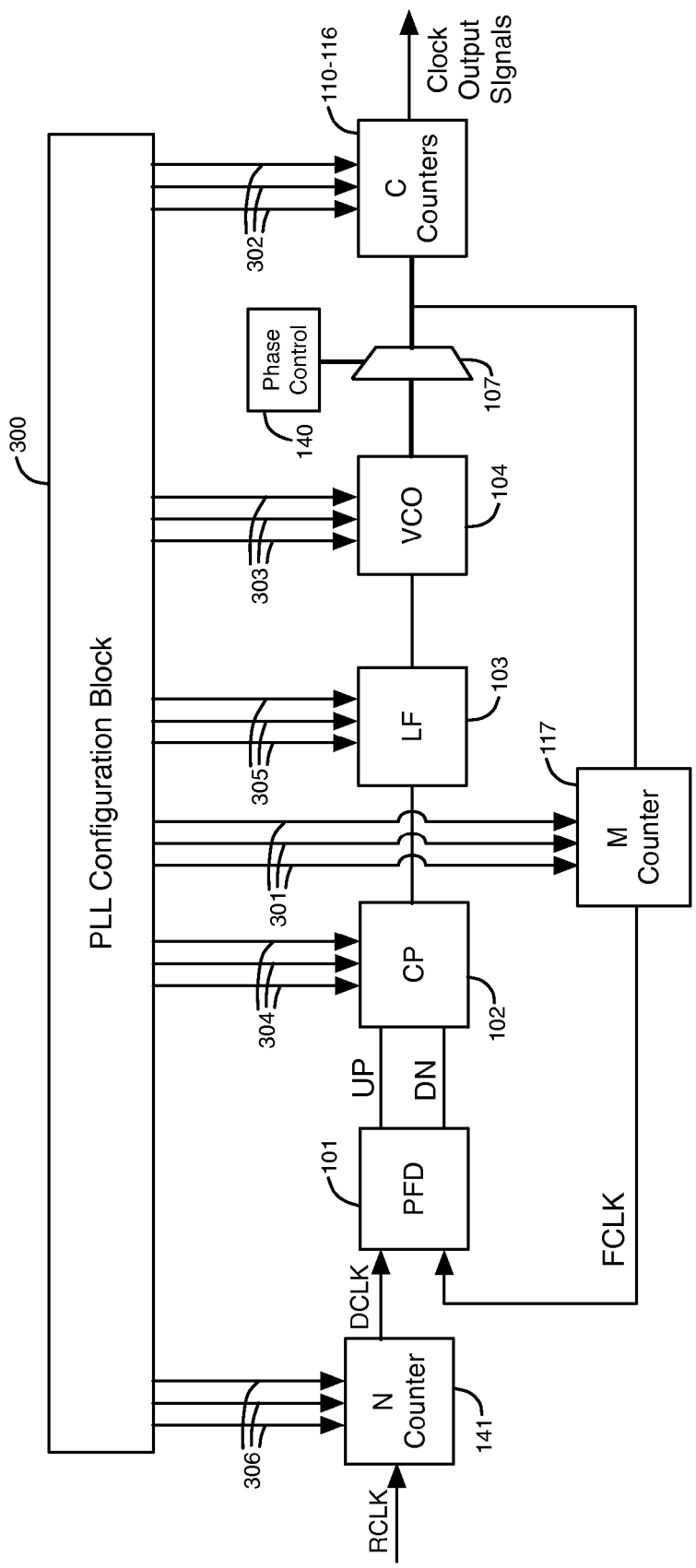
FIG. 3 illustrates a PLL configuration block that is used to configure circuit blocks in a PLL, according to another embodiment of the present invention.

FIG. 3 illustrates a PLL configuration block 300 generating a number of configuration signals that control several configurable settings of a PLL, according to another embodiment of the present invention. PLL configuration block 300 generates the configuration signals 301-306 using configuration data that is loaded into the PLL during configuration mode or during user mode. The states of configuration signals 301-306 are stored in memory in PLL configuration block 300. Although three arrows are shown in FIG. 3 for each set of configuration signals 301-306, each set of configuration signals 301-306 can include any desired number of configuration signals.

The techniques of the present invention allow discrete changes to be made in various performance characteristics of PLL 100 by loading in new PLL configuration data. For example, a discrete change in the input frequency of clock signal RCLK can be compensated for by changing frequency divider ratios of one or both of counters 117 and 141 to maintain the frequencies of the output signals of VCO 104 within their valid frequency operating range.

Several settings of PLL 100 can be reconfigured during user mode, including the frequency divider ratio N of the input counter 141, the frequency divider ratios C0-C6 of the output counters 110-116, and the frequency divider ratio M of feedback counter 117. By adjusting one or more of the frequency ratios N and/or M of counters 141 and 117 during user mode, PLL 100 can dynamically adjust the operating frequency range for reference clock signal RCLK that causes VCO 104 to generate output signal frequencies within its valid frequency operating range.

PLL configuration block 300 outputs configuration signals 301 for setting the frequency divider ratio M of feedback counter 117. PLL configuration block 300 outputs configuration signals 302 for setting the frequency divider ratios of output C counters 110-116. PLL configuration block 300 outputs configuration signals 306 for setting the frequency divider ratio N of input counter 141.

The frequency $F_{OUT}$ of the output signals of VCO 104 is a function of the frequency $F_{IN}$ of the reference clock signal RCLK, the frequency divider ratio N of counter 141, and the frequency divider ratio M of counter 117, as shown in equation (1).

$$F_{OUT} = \frac{F_{IN} \times M}{N} \quad (1)$$

New PLL configuration data can be loaded into PLL 100 using PLL configuration block 300 to adjust the frequency divider ratios N and/or M of PLL 100. The new frequency divider ratios N and/or M are selected to maintain the output signal frequencies of VCO 104 within its valid frequency range. As a result, PLL 100 can continue to maintain its performance characteristics (e.g., jitter characteristics) after discrete changes in the input frequency of reference clock signal RCLK. The frequency divider ratios C0-C6 of counters 110-116 can also be adjusted to change the frequencies of the PLL output signals using configuration signals 302.

All of counters 110-117 and 141 have adjustable frequency divider ratios, C0-C6, M, and N. A counter circuit that provides an adjustable frequency divider ratio can be, for example, a preset divide-by-N counter circuit. A preset divide-by-N counter circuit typically includes several flip-flops coupled together. The flip-flops are clocked by an input clock signal. For example, flip-flops in counter 141 are clocked by the RCLK clock signal. Signals representing the binary value of a desired frequency division ratio are loaded into the counter during a preset operation. The counter then counts down from the frequency division ratio binary value to zero (or counts up from zero to the frequency division ratio). The binary value of the output signals of the flip-flops is changed in response to edges of the input clock signal. When the counter finishes counting, the counter generates an edge on its output clock signal. The counter then begins to count down (or up) again. The frequency division ratio of the counter can be changed by loading signals having a different binary value into the counter.

Some system applications require that the duty cycles of the PLL clock output signals change dynamically to capture data. Each of the counters in the PLL of FIG. 3 receives configuration signals that determine the duty low count (e.g., the number of VCO cycles that the output clock signal remains low) and the duty high count (e.g., the number of VCO cycles that the output clock signal remains high). The duty cycle D of a clock signal is determined by equation (2).

$$D = \frac{CH}{(CH + CL)} \quad (2)$$

In equation (2), CH is the amount of time that the clock signal is high in a period of the clock signal, and CL is the amount of time that the clock signal is low in a period of the clock signal. Configuration signals 302 control the duty cycle of the output clock signals generated by the counter circuits 110-116. The duty cycle of the output clock signals can vary from 10% to 90%. PLL configuration block 300 can dynamically change the duty cycles of the output clock signals of the counter circuits while the PLL is in user mode.

The dynamic reconfiguration embodiments of the present invention also allow dynamic coarse phase shift, which is a phase shift by more than one VCO clock cycle. Each counter circuit receives configuration signals that allow the counter circuit to count after skipping a specific number of clock cycles from the VCO that represent the phase shift. By choosing a different number of skip cycles for the feedback M and output C counter circuits, coarse phase shift is possible so that the input clock and output clock signals can be more than one clock cycle apart. The dynamic configuration embodiments of the present invention allow the states of configuration signals 301-302 and 306 to be changed dynamically while the PLL is in use in a system (i.e., during user mode), thus allowing dynamic coarse phase shift.

Other blocks of the PLL system can also receive configuration signals from PLL configuration block 300. For example, CP 102 receives configuration signals 304 from block 300, LF 103 receives configuration signals 305 from block 300, and VCO 104 receives configuration signals 303 from block 300. Configuration signals 304 determine the amount of current that CP 102 provides to and drains from loop filter 103 in response to pulses on the UP and DN signals from PFD 101. Configuration signals 305 determine the resistance and the capacitance of LF 103. Further details of how the resistance and capacitance of LF 103 can be configured are described below with respect to FIG. 5. Configuration signals 303 determine the gain of VCO 104.

The bandwidth of a PLL is determined by the amount of charge pump current, the loop filter 103 resistance and capacitance, the feedback counter 117 frequency divider ratio, and the gain of VCO 104. The PLL bandwidth is an indication of how quickly the PLL responds to changes in the phase and frequency of the input reference clock signal RCLK. The bandwidth also indicates how much noise the PLL can reject from the input reference clock signal RCLK and within the PLL. The amount of PLL bandwidth is an important system requirement.

While a PLL is in use in a complex system or environment, the amount of noise and sources of noise that effect the system can change. The bandwidth of the PLL determines its noise rejection capability. In a system where noise from the input reference clock signal to the PLL is dominant, a low bandwidth helps to reject noise from the input reference clock signal. When the noise of the internal VCO or the power supply noise is dominant, a large bandwidth helps to reject the dominant noise.

While a PLL is in use in a system, the amount of noise and the sources of noise can change, causing the original configuration that represents a specific bandwidth to no longer be suitable. The configurable settings of CP 102, LF 103, VCO 104, and counters 110-116, 117, and 141 can be reconfigured by loading new configuration data into block 300 to adjust the bandwidth of the PLL until the PLL noise rejection is maximized, without exiting the user mode. The new configuration data controls the states of signals 301-306.

Figure 4:
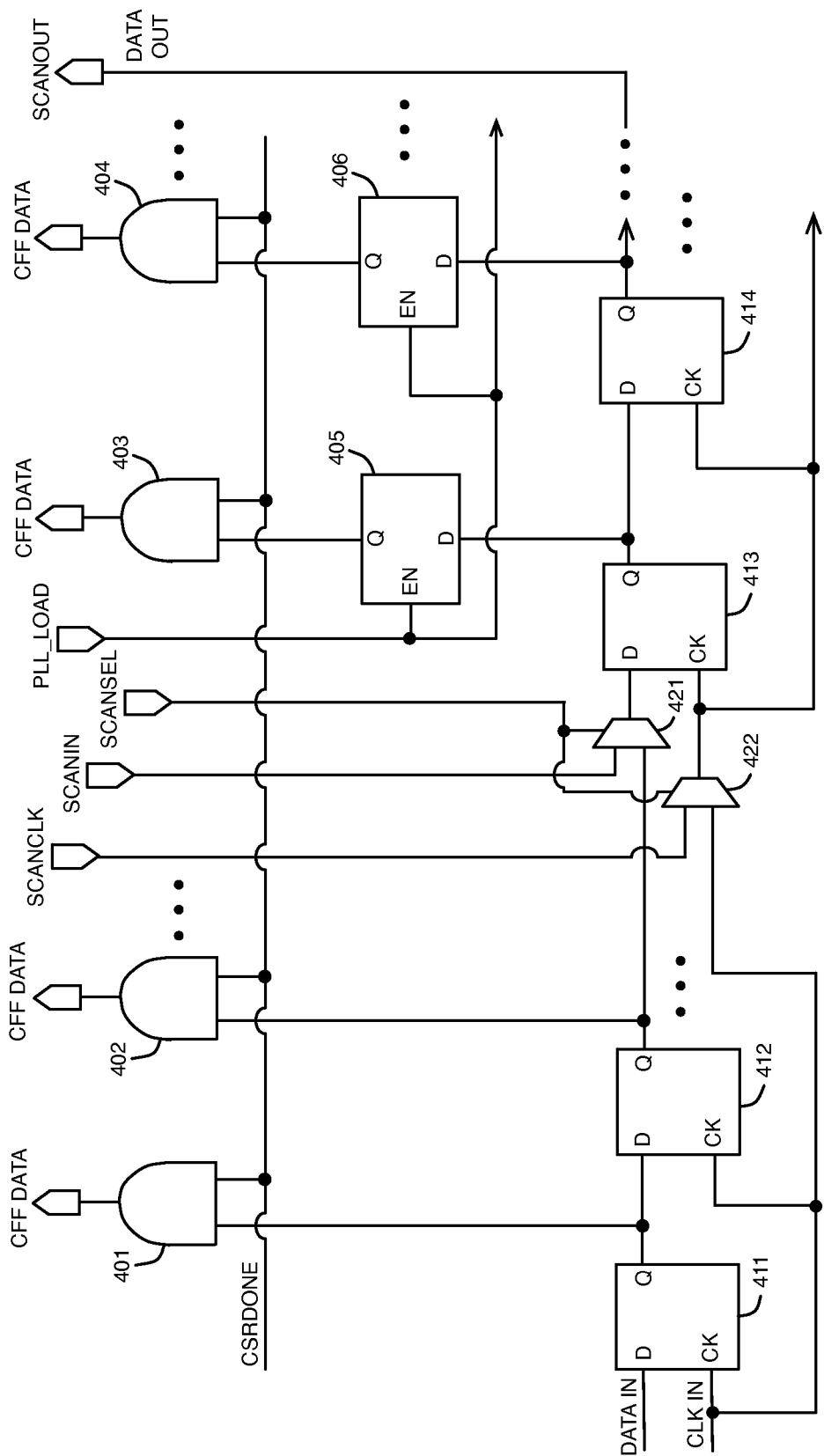
FIG. 4 illustrates circuitry that can be used in an integrated circuit (IC) to dynamically reconfigure a PLL or another type of programmable circuit block, according to another embodiment of the present invention.

FIG. 4 illustrates circuitry that can be used in an integrated circuit (IC) to dynamically reconfigure a PLL, DLL, or another type of programmable circuit block, according to another embodiment of the present invention. The circuitry shown in FIG. 4 is an example of a configuration block that can be used to configure and reconfigure the programmable settings of a configurable PLL, DLL, or another type of programmable circuit block. The circuitry shown in FIG. 4 is an example of PLL configuration block 300. The circuitry shown in FIG. 4 is typically used in a programmable logic integrated circuit. Although the circuitry of FIG. 4 can be used in any type of integrated circuit that has programmable circuit blocks.

The circuitry of FIG. 4 has a set of logic gates including AND gates 401-404, a set of configuration latches including latches 405-406, a set of input/output configuration shift registers (IOCSRs) including registers 411-414, and multiplexers 421-422. Inputs SCANCLK, SCANIN, and SCANSEL, and output SCANOUT can be coupled to pins of the integrated circuit (IC).

The IOCSRs, including registers 411-414, are flip-flops that store configuration data for configuring peripheral circuitry in a programmable logic IC, including a PLL such as PLL 100. IOCSRs are typically located around the periphery of the IC.

Only a subset of the AND gates, registers, and latches are shown in FIG. 4 to simplify the drawing. However, a programmable IC of the present invention can have hundreds or thousands of IOCSRs, PLL configuration latches, and corresponding AND gates. For example, if PLL 100 is designed to receive 300 configuration bits, the IC should have at least 300 PLL configuration latches, 300 IOCSRs for storing the PLL configuration data, and 300 corresponding AND gates.

During the configuration mode of the programmable logic IC, the SCANSEL control signal is driven to a logic state (e.g., from a pin) that causes the IOCSRs to accept configuration data from the DATA IN input. Specifically, SCANSEL is set to cause multiplexer 421 to couple the Q output of register 412 to the D input of register 413. SCANSEL also causes multiplexer 422 to transmit a clock signal at CLK IN to the clock inputs (CK) of registers 413, 414, etc.

After multiplexers 421-422 have been set as previously described, configuration data can be serially shifted into the IOCSRs through the DATA IN input during the configuration mode in the form of configuration bits. The configuration bits are serially shifted through the IOCSRs 411-414, etc. in response to edges of a clock signal. The clock signal is transmitted from the CLK IN input to the clock inputs (CK) of each of the IOCSR flip-flops during the configuration mode.

The configuration data that is loaded into the IOCSRs 413, 414, etc. between multiplexer 421 and the SCANOUT output is used to configure or reconfigure the programmable settings of PLL 100, as shown in FIG. 3. The configuration data stored in IOCSRs 413, 414, etc. up to the SCANOUT output is referred to as PLL configuration data.

A load signal at input PLL LOAD is transmitted to the enable (EN) input of each of the PLL configuration latches 405, 406, etc. In response to an edge on a load signal at PLL_LOAD, the PLL configuration data is loaded into PLL configuration latches 405-406, etc. For example, flip-flops 405-406 store at their Q outputs the configuration data bits from registers 413-414 in response to a rising edge on the load signal at PLL_LOAD.

After the configuration data is loaded into the IOCSRs and the PLL configuration latches, the CSRDONE signal is pulled to a logic high in configuration mode, causing AND gates 401-404, etc. to transmit the configuration data bits to various peripheral circuits in the programmable IC. AND gates 403, 404, etc. transmit the PLL configuration data stored in PLL configuration latches 405, 406, etc. to PLL configuration block 300 for configuring the programmable settings of PLL 100. Alternatively, PLL configuration block 300 can include latches 405, 406, etc. and AND gates 403, 404, etc. AND gates 401, 402, etc. transmit the configuration data from registers 411, 412, etc. to other peripheral circuitry.

After the configuration mode is complete, the programmable logic IC is operated in a user mode, during which the IC performs the functions it has been programmed to perform by the configuration data.

According to an embodiment of the present invention, certain programmable settings of PLL 100 can be dynamically reconfigured during user mode using the architecture of FIG. 4, without having to reconfigure all of the other peripheral programmable circuit blocks on the IC. To reconfigure PLL 100, new configuration data is loaded into the IOCSRs that store the PLL configuration data. As mentioned above, these IOCSRs are located between multiplexer 421 and the SCANOUT output. IOCSRs 413-414 are examples of these registers.

According to some embodiments of the present invention, not all of the configurable settings in PLL 100 are user reconfigurable during the user mode. For example, some of the startup settings of the PLL can only be reconfigured in the configuration mode.

To initiate the dynamic reconfiguration process in the user mode, the SCANSEL signal is driven to a logic state that causes multiplexers 421-422 to couple the SCANIN data input and the SCANCLK clock input to the D and CK inputs of register 413, respectively. During the dynamic reconfiguration process, new configuration scan data is serially loaded into IOCSRs 413, 414, etc. through multiplexer 421 from the SCANIN input during user mode. Also, a SCANCLK clock signal is driven to IOCSRs 413, 414, etc. through multiplexer 422 from the SCANCLK input. The SCANCLK clock signal clocks IOCSRs 413, 414, etc. during the dynamic reconfiguration process in user mode.

The SCANCLK, SCANIN, and SCANSEL inputs allow new PLL configuration data to be loaded into PLL 100 during user mode without re-loading configuration data into all of the IOCSRs. For example, because SCANIN is coupled to transmit data to register 413 through multiplexer 421 bypassing registers 411-412, new configuration data bits do not need to be re-loaded into IOCSRs 411-412.

After the new configuration data is loaded into IOCSRs 413, 414, etc., a signal at the PLL_LOAD input changes state, causing the PLL configuration latches 405-406, etc. to store the new PLL configuration data for PLL 100. Subsequently, the new PLL configuration data is transmitted to PLL configuration block 300 for dynamic reconfiguration of PLL 100 during user mode. AND gates 403, 404, etc. do not block the new PLL configuration data from being sent to PLL 100, because the CSRDONE signal remains high during user mode.

In the user mode, PLL 100 can be reconfigured to generate output signals that are within the valid operating frequency range of VCO 104 and other circuitry in the PLL. The valid operating frequency range of VCO 104 corresponds to a valid input frequency range for input clock signal RCLK. If it is known that the frequency of the input clock signal RCLK will deviate outside the valid input frequency range, one or more settings in PLL 100 can be reconfigured using new PLL configuration data that is loaded into the IC through the circuitry shown in FIG. 4.

Other settings of PLL 100 that are programmable include the duty cycle of the output and feedback counters 110-117, the resistance of loop filter 103, the capacitance of loop filter 103, the output current of charge pump 102, and the gain of VCO 104. Any of these features of PLL 100 can be configured during configuration mode and reconfigured during user mode using the circuitry of FIG. 4.

The bandwidth of PLL 100 is proportional to the resistance in loop filter 103, the current generated by charge pump 102, the gain of VCO 104, and the inverse of the frequency divider ratio M of counter 117. The bandwidth of PLL 100 can be changed by adjusting one or more of the frequency divider ratio M of counter 117, the resistance and capacitance of loop filter 103, the output current of charge pump 102, and/or the gain of VCO 104.

As an example, the bandwidth of PLL 100 can be set to a low value to reject noise in the input reference clock signal, and the bandwidth of PLL 100 can be set to a high value to reject noise from the VCO. These changes to the PLL settings can be implemented by loading new configuration bits into the IOCSRs and block 300 during user mode.

Figure 5:
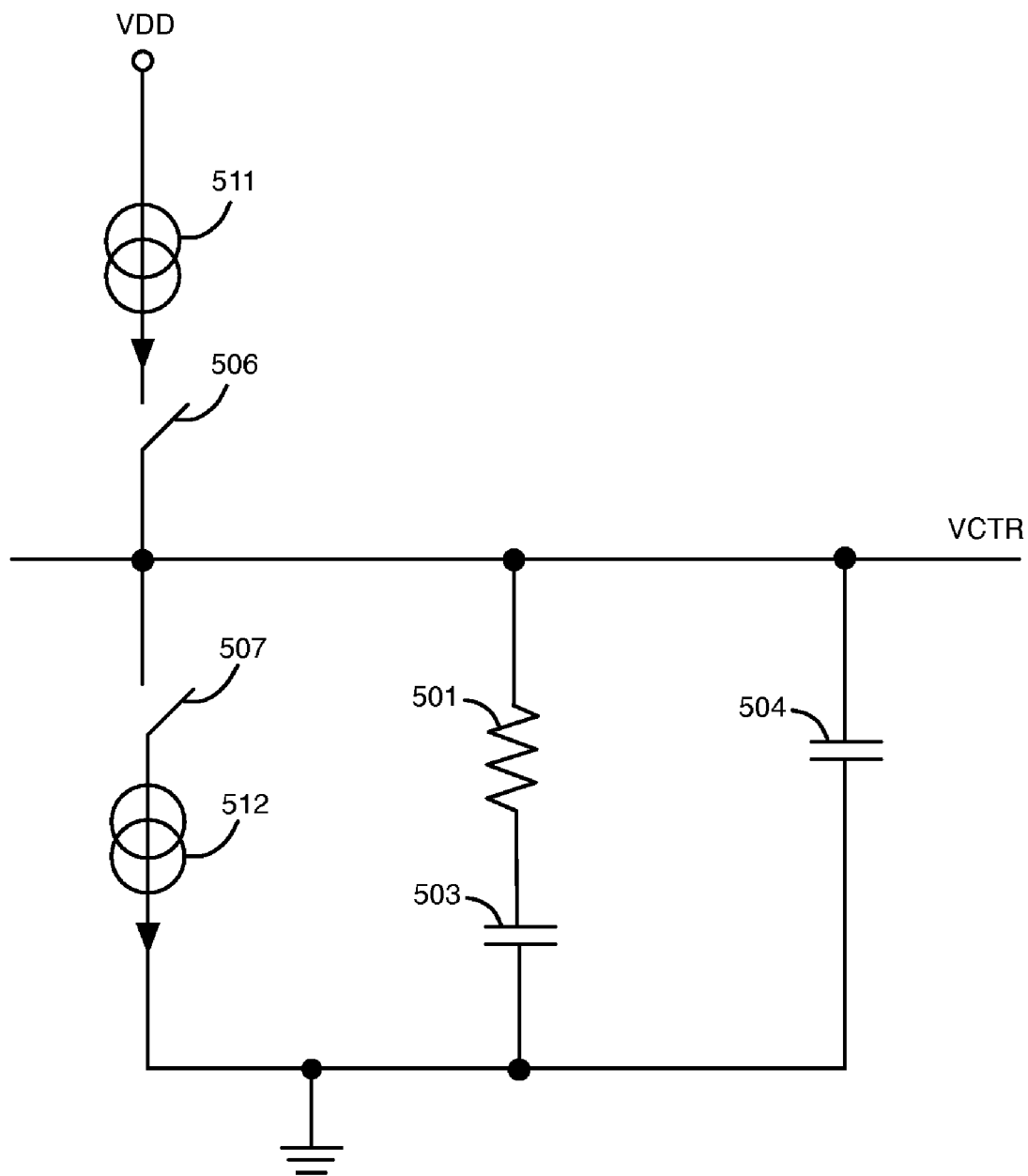
FIG. 5 illustrates an example of a loop filter having a variable resistance and a variable capacitance that can be adjusted by PLL configuration data, according to an embodiment of the present invention.

FIG. 5 illustrates an example of a loop filter 500 with a variable resistance and a variable capacitance that can be adjusted by PLL configuration data, according to an embodiment of the present invention. The loop filter 500 of FIG. 5 is an example of loop filter 103 shown in FIGS. 1A and 3.

The resistance of loop filter 500 is implemented by a network of resistors. Resistor 501 shown in FIG. 5 represents a network of resistors that are coupled together in series. A pass gate (not shown) is coupled in parallel with each of the resistors. Resistor configuration bits selectively turn on or off the pass gates to effect the net resistance of loop filter 500. The resistor configuration bits are transmitted to loop filter 500 from PLL configuration block 300 as configuration signals 305. The resistance of the resistor network in loop filter 500 can be changed during user mode by shifting new resistor configuration bits into IOCSRs 413, 414, etc. through the SCANIN input.

According to another embodiment of the present invention, the resistance and/or the capacitance of loop filter 500 can be changed to effect the bandwidth of PLL 100. For example, the bandwidth of PLL 100 can be changed to a new value. Alternatively, the bandwidth of PLL 100 can be maintained at a constant value after the frequency divider ratio M of counter 117 has been changed. The capacitance of loop filter 500 can also be adjusted to maintain the stability of PLL 100 after one or more of the frequency divider ratios of counter circuits 141 and 117 have been changed.

In the embodiment of FIG. 5, the capacitance of loop filter 500 is implemented by a network of capacitors that are coupled together in parallel. Capacitor 504 represents the network of capacitors. Pass gates (not shown) are coupled to capacitors 504. Capacitor configuration bits selectively turn the pass gates on or off to effect the net capacitance of loop filter 500. The capacitor configuration bits are transmitted to loop filter 500 from PLL configuration block 300 as configuration signals 305. The capacitance of loop filter 500 can be adjusted by loading new PLL configuration bits into IOCSRs 413, 414, etc. through the SCANIN input during user mode, as described above.

Loop filter 500 also includes capacitor 503, which is coupled in series with resistor 501. Current source 511 and switch 506 represent charge pump 102 supplying current to loop filter 500 in response to UP pulses. Current source 512 and switch 507 represent current draining from loop filter 500 in response to DN pulses.

Figure 6:
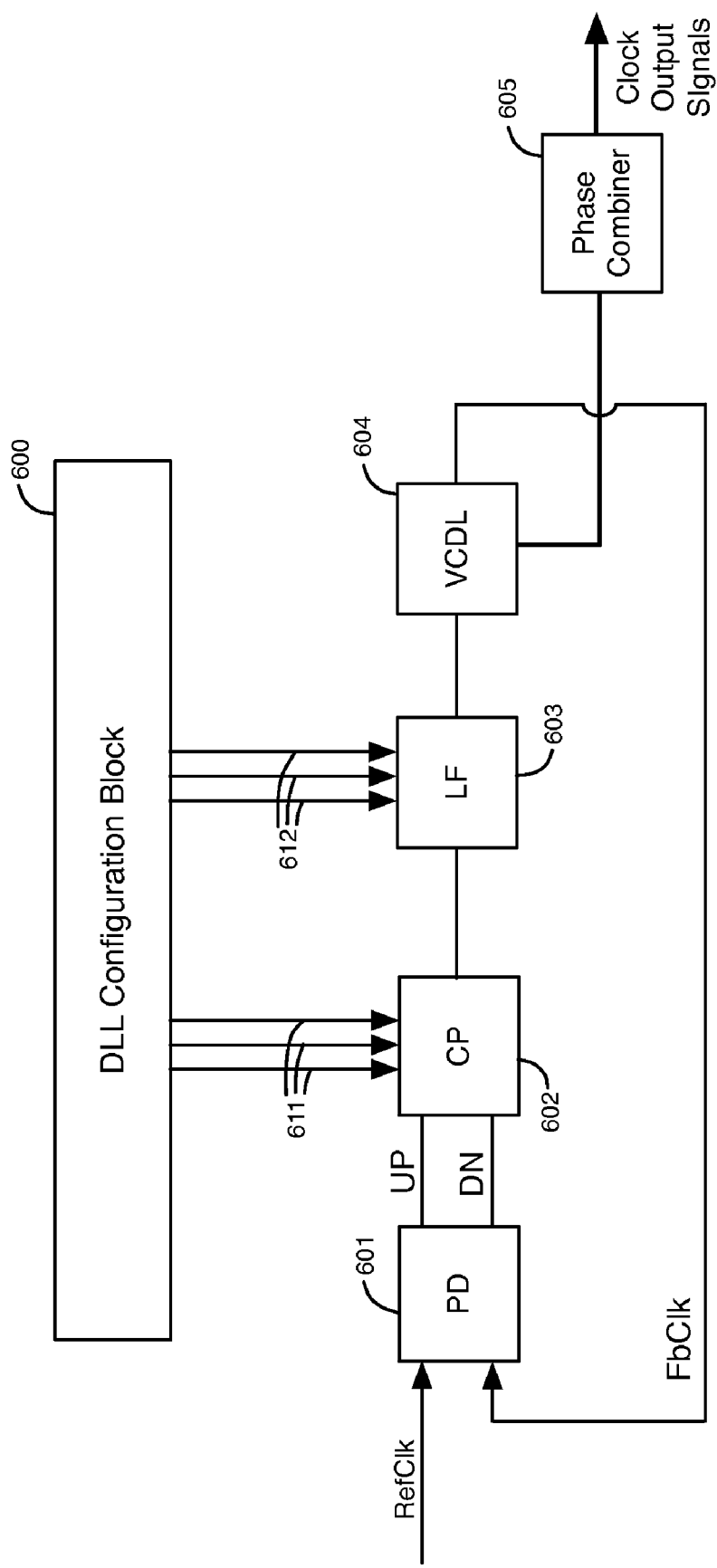
FIG. 6 illustrates a DLL configuration block that generates configuration signals for controlling configurable settings of a delay-locked loop (DLL), according to another embodiment of the present invention.

FIG. 6 illustrates a DLL configuration block 600 that generates configuration signals for controlling configurable settings of a delay-locked loop (DLL), according to another embodiment of the present invention. The DLL of FIG. 6 includes a phase detector (PD) 601, a charge pump (CP) 602, a loop filter (LF) 603, a voltage controlled delay line (VCDL) 604, and a phase combiner circuit 605.

The circuitry shown in FIG. 4 can be used to implement DLL configuration block 600. DLL configuration block 600 generates configuration signals 611-612. DLL configuration block 600 generates configuration signals 611-612 using configuration data that is loaded into the DLL during configuration mode or user mode. DLL configuration block 600 can re-load new configuration data during user mode to reconfigure the programmable settings of the DLL as discussed above with respect to FIG. 4.

Configuration signals 611 are used to control the configurable settings of charge pump 602. Configuration signals 612 are used to control the configurable settings of loop filter 603, such as its resistance and/or capacitance. DLL configuration block 600 can also transmit other configuration signals to the DLL of FIG. 6 to configure additional programmable settings of the DLL.

Figure 7:
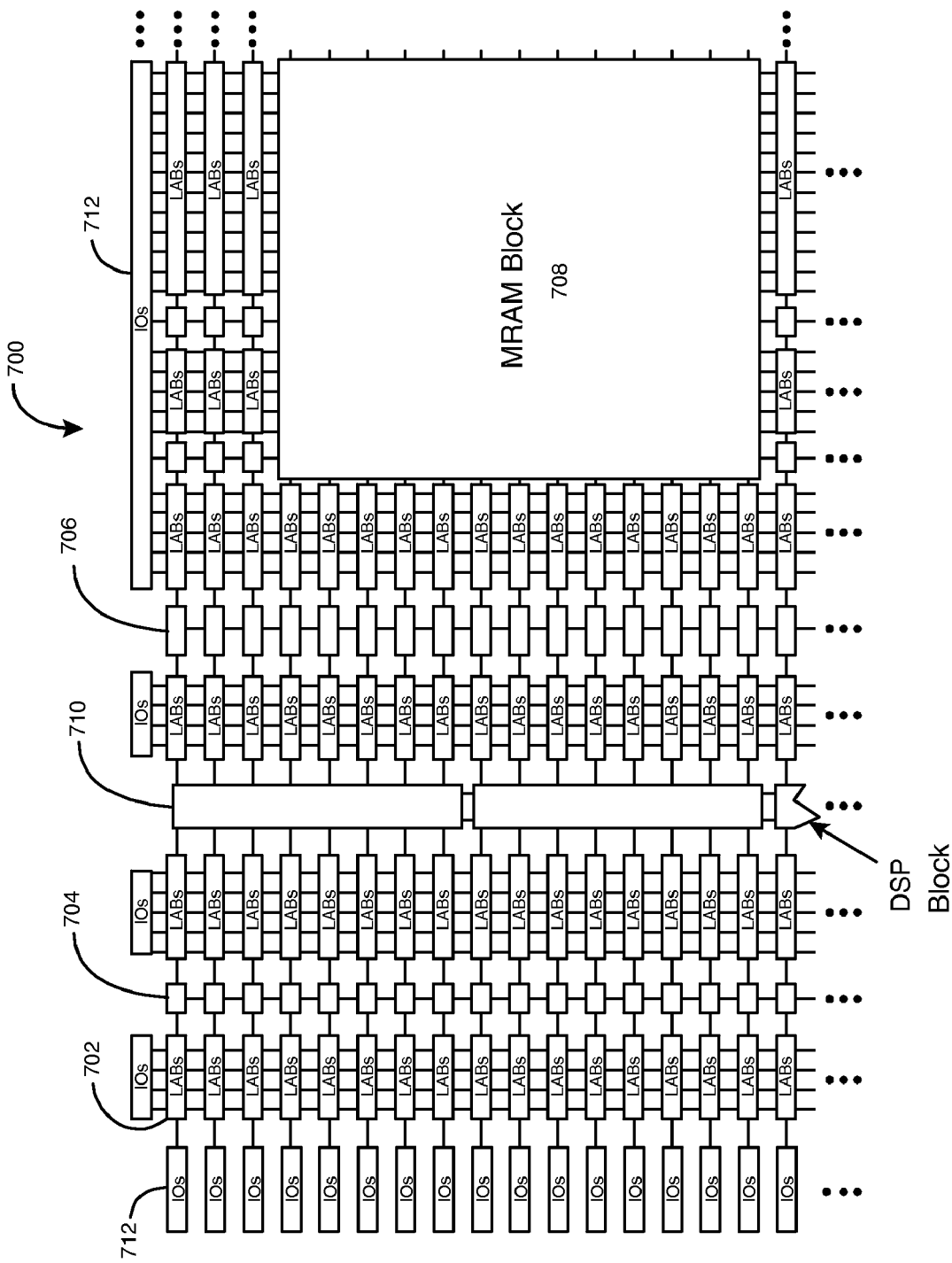
FIG. 7 is a simplified block diagram of a field programmable gate array (FPGA) that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that embodiments of the present invention can be used in numerous types of integrated circuits, including programmable logic integrated circuits and application specific integrated circuits (ASICs). Programmable logic integrated circuits include, for example, field programmable gate arrays (FPGAs), programmable logic devices (PLDs), complex programmable logic devices (CPLDs), and programmable logic arrays (PLAs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
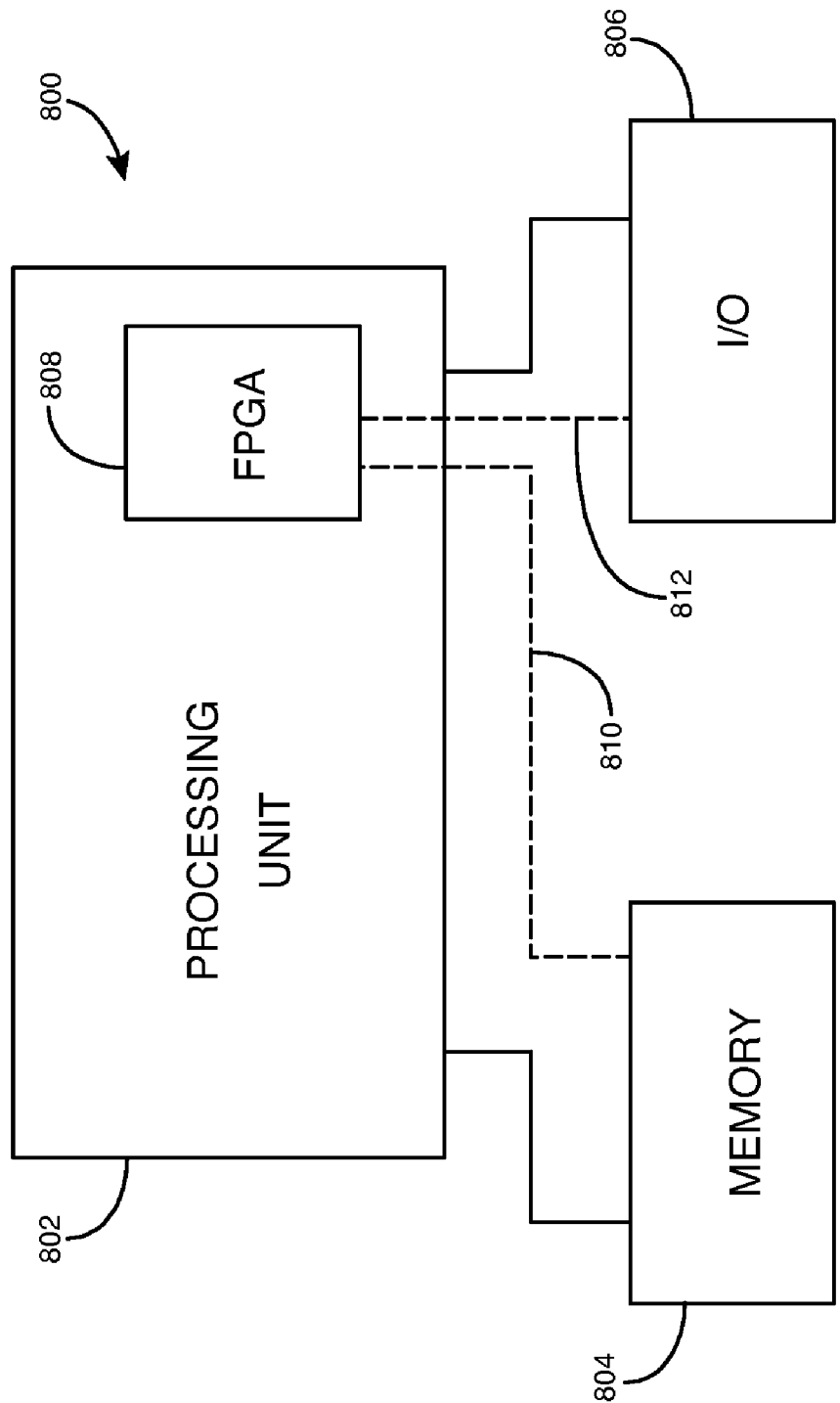
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention.

What is claimed is:

1. A clock signal generator circuit that receives periodic signals, the clock signal generator circuit comprising:
    a delay circuit that delays the periodic signals to generate delayed signals;
    a first multiplexer that selects one of the delayed signals in response to a first select signal to generate an output clock signal;
    a second multiplexer that selects one of the periodic signals in response to a second select signal; and
    flip-flops that generate the first and the second select signals in response to the periodic signal selected by the second multiplexer.

2. The clock signal generator circuit defined in claim 1 wherein the delay circuit has a programmable delay that can be adjusted to prevent glitches in the output clock signal.

3. The clock signal generator circuit defined in claim 1 wherein the flip-flops are coupled together to form a barrel shifter.

4. The clock signal generator circuit defined in claim 3 wherein the barrel shifter shifts a phase of the output clock signal in a first direction in response to a first logic state on a directional signal, and the barrel shifter shifts a phase of the output clock signal in a second direction in response to a second logic state on the directional signal.

5. The clock signal generator circuit defined in claim 1 wherein the clock signal generator circuit is in a phase-locked loop.

6. A method for phase shifting periodic output signals, the method comprising:
    delaying the periodic output signals using a delay circuit to generate delayed signals;
    selecting one of the delayed signals in response to at least one first select signals signal using a first multiplexer to provide an output clock signal;
    selecting one of the periodic output signals as a selected periodic output signal in response to at least one second select signal using a second multiplexer; and
    generating the first select signal using a storage circuit in response to the selected periodic output signal.

7. The method defined in claim 6 further comprising:
    changing the first select signal based on a control signal to cause the first multiplexer to generate a phase shift in the output clock signal.

8. A method for phase shifting periodic output signals, the method comprising:
    delaying the periodic output signals using a delay circuit to generate delayed signals;
    selecting one of the delayed signals in response to at least one first select signal using a first multiplexer to provide an output clock signal;
    selecting one of the periodic output signals as a selected periodic output signal in response to at least one second select signal using a second multiplexer; and
    changing the first select signal in response to the selected periodic output signal using a storage circuit to cause the first multiplexer to generate a phase shift in the output clock signal.

9. The method defined in claim 8 wherein the storage circuit is a barrel shifter circuit that shifts a phase of the output clock signal in a first direction in response to a first logic state on a directional signal, and the barrel shifter circuit shifts a phase of the output clock signal in a second direction in response to a second logic state on the directional signal.

10. The method defined in claim 6 further comprising:
    adjusting a delay that the delay circuit provides to the delayed signals in response to at least one control signal to prevent glitches in the output clock signal.

11. A phase shift circuit that receives periodic signals, the phase shift circuit comprising:
    a delay circuit that delays the periodic signals to generate delayed clock signals;
    a first multiplexer that selects one of the delayed clock signals in response to a first select signal to generate an output clock signal, wherein the first multiplexer shifts a phase of the output clock signal by selecting a different one of the delayed clock signals as the output clock signal in response to the first select signal;
    a second multiplexer that selects one of the periodic signals in response to a second select signal; and
    a storage circuit that provides the first select signal in response to the periodic signal selected by the second multiplexer.

12. The phase shift circuit defined in claim 11 wherein the phase shift circuit is in an integrated circuit.

13. The phase shift circuit defined in claim 11 wherein the storage circuit comprises:
    flip-flops that generate the first and the second select signals, wherein the flip-flops change a state of the first select signal in response to the periodic signal selected by the second multiplexer and a directional signal that controls a direction of the phase shift in the output clock signal to cause the first multiplexer to shift the phase of the output clock signal by selecting a different one of the delayed clock signals as the output clock signal.

14. The phase shift circuit defined in claim 13 wherein flip-flops are coupled together to form a barrel shifter.

15. The phase shift circuit defined in claim 11 wherein the delay circuit has a programmable delay that is configured to prevent glitches in the output clock signal.

16. The phase shift circuit defined in claim 11 wherein the delay circuit generates delays in the delayed clock signals that cause the first select signal to undergo a state change during a logic low state in a first one of the delayed clock signals and a logic high state in a second one of the delayed clock signals, the first one of the delayed clock signals being selected by the first multiplexer as the output clock signal before the first select signal undergoes the state change, and the second one of the delayed clock signals being selected by the first multiplexer as the output clock signal after the first select signal undergoes the state change.

17. The phase shift circuit defined in claim 11 wherein the phase shift circuit is in a phase-locked loop.

18. A method for phase shifting an output clock signal, the method comprising:

delaying periodic output signals using a delay circuit to generate first and second delayed clock signals, wherein the delay circuit generates delays in the first and the second delayed clock signals relative to the periodic output signals that cause a first select signal to undergo a state change while the first delayed clock signal is in a logic low state and the second delayed clock signal is in a logic high state;

selecting the first delayed clock signal as the output clock signal in response to the first select signal before the state change in the first select signal;

selecting the second delayed clock signal as the output clock signal in response to the first select signal after the state change in the first select signal;

selecting one of the periodic output signals as a selected periodic output signal in response to a second select signal; and generating the state change in the first select signal in response to the selected periodic output signal to generate a phase shift in the output clock signal.

19. The method defined in claim 18 wherein generating the state change in the first select signal in response to the selected periodic output signal to generate the phase shift in the output clock signal further comprises generating the state change in the first select signal in response to the selected periodic output signal to generate a negative phase shift in the output clock signal.

20. The method defined in claim 18 wherein the delay circuit generates delays in the first and the second delayed clock signals relative to the periodic output signals that cause the first select signal to undergo the state change halfway between a rising edge in the second delayed clock signal and a rising edge in the first delayed clock signal.

\* \* \* \* \*